(12) United States Patent
Nagatomo (10) Patent No.: US 7,796,666 B2
(45) Date of Patent: Sep. 14, 2010

(54) STRUCTURE HAVING PHOTONIC CRYSTAL LAYER AND SURFACE EMITTING LASER INCLUDING THE SAME

(75) Inventor: Yasuhiro Nagatomo, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/105,454

(22) Filed: Apr. 18, 2008

(65) Prior Publication Data

US 2008/0259984 A1  Oct. 23, 2008

(30) Foreign Application Priority Data

Apr. 19, 2007  (JP)  ............................. 2007-110109

(51) Int. Cl.
*H01S 5/00* (2006.01)
(52) U.S. Cl. .............................. 372/50.124; 372/50.12
(58) Field of Classification Search ................ 359/572, 359/548; 385/4; 430/321; 372/46.01
See application file for complete search history.

(56) References Cited

U.S. PATENT DOCUMENTS

| 5,332,681 A * | 7/1994 | Tonucci et al. .............. 438/493 |
| 6,154,480 A | 11/2000 | Magnusson et al. |
| 6,674,778 B1 * | 1/2004 | Lin et al. .................. 372/46.01 |
| 6,683,898 B2 * | 1/2004 | Østergaard et al. ........ 372/43.01 |
| 7,368,870 B2 * | 5/2008 | Wang .......................... 313/580 |
| 2002/0048422 A1 * | 4/2002 | Cotteverte et al. ............. 385/4 |
| 2008/0117941 A1 | 5/2008 | Nagatomo ................... 372/19 |
| 2008/0117942 A1 | 5/2008 | Nagatomo et al. ............ 372/19 |

OTHER PUBLICATIONS

Kurt et al., "Annular Photonic Crystals", Optics Express, vol. 13, No. 25, 10316-10326 (2005).*
Rosenberg et al., "Guided Resonances in Asymmetrical GaN Photonic Crystal Slabs Observed in the Visible Spectrum", Optics Express, vol. 13, No. 17, 6564-6571 (2005).
Li et al., "Light Propagation in Semi-Infinite Photonic Crystals and Related Waveguide Structures", Physical Review B, vol. 68 155101 (2003).

* cited by examiner

*Primary Examiner*—Minsun Harvey
*Assistant Examiner*—Tuan N. Nguyen
(74) *Attorney, Agent, or Firm*—Fitzpatrick, Cella, Harper & Scinto (57) ABSTRACT

A structure has a photonic crystal layer comprising a first member made of a material having a first refractive index; and a second member made of a material having a second refractive index, wherein the first member has a plurality of holes periodically arranged, and the second member is placed in each of the holes so that a center of the second member is staggered from a center of the hole on a plane of the photonic crystal layer.

6 Claims, 11 Drawing Sheets

FIG. 12A
Δx=Δy=20nm,
x-POLARIZED LIGHT

FIG. 12B
Δx=Δy=20nm,
y-POLARIZED LIGHT

FIG. 12C
Δx=30nm, Δy=10nm,
x-POLARIZED LIGHT

FIG. 12D
Δx=30nm, Δy=10nm,
y-POLARIZED LIGHT

FIG. 12E
Δx=40nm, Δy=10nm,
x-POLARIZED LIGHT

FIG. 12F
Δx=40nm, Δy=10nm,
y-POLARIZED LIGHT

FIG. 13A

FIG. 13B

STRUCTURE HAVING PHOTONIC CRYSTAL LAYER AND SURFACE EMITTING LASER INCLUDING THE SAME

BACKGROUND OF THE INVENTION

1. Field of the Invention

The present invention relates to a structure having a photonic crystal layer and a surface emitting laser including the structure.

2. Description of the Related Art

In recent years, many examinations have been reported relating to optical devices using photonic crystals. OPTICS EXPRESS, vol. 13, No. 17, 6564 (2005) (hereinafter, referred to as non-patent document 1) discusses examinations relating to a GR mode (Guided Resonance Mode) by using a photonic crystal having the structure shown in FIG. 10.

The GR mode is detected via a phenomenon where transmittance changes significantly in a transmittance spectrum. The GR mode is known to be closely connected to a radiation mode.

Figure 10:
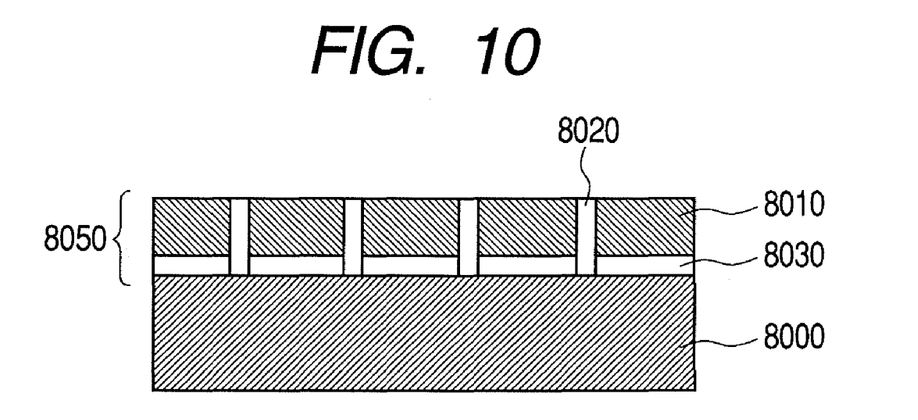
FIG. 10 is a section view illustrating a photonic crystal disclosed in the non-patent document 1.

FIG. 10 shows a sapphire substrate 8000, a photonic crystal layer 8050 where small holes 8020 are formed in a periodical arrangement in GaN 8010, and a nucleation layer 8030 (AlN).

When the wavelength of light incident perpendicularly on the photonic crystal layer shown in FIG. 10 is adjusted within a wavelength region where reflectance increases significantly by the GR mode, the following phenomenon occurs.

Light incident on the photonic crystal is reflected in the same manner as light incident on an ordinary reflecting mirror.

The non-patent document 1 discusses variations in the GR mode by using simulation.

Figure 11A:
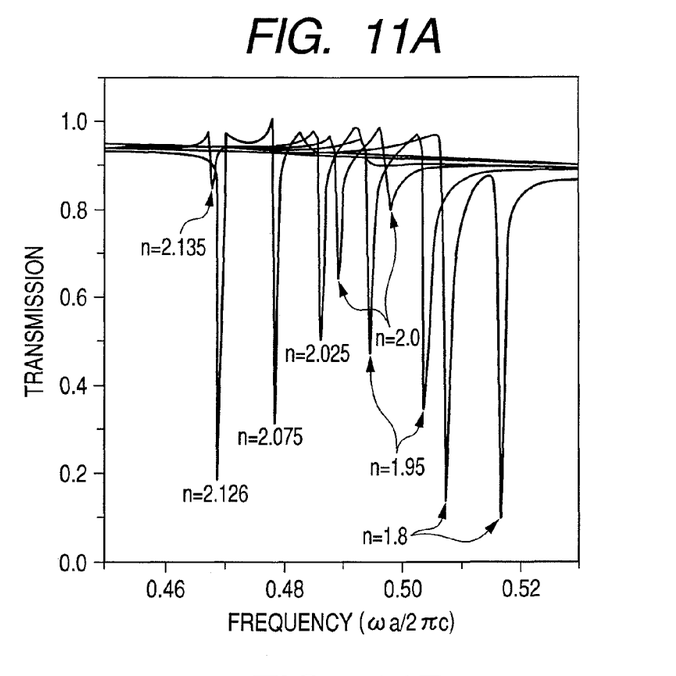
FIGS. 11A and 11B are graphs showing transmittance spectra of a photonic crystal in the non-patent document 1.

That is, the document discusses variations in the GR mode when a refractive index of a sapphire substrate (refractive index: 1.8) varies adjacent to the photonic crystal layer 8050 (GaN has a refractive index of 2.37) by using simulation (FIG. 11A).

The peak value of reflectance in the GR mode is known to achieve almost 100% in theory.

By using this, for example, a multilayer mirror (DBR) used in a vertical cavity surface emitting laser (VCSEL) may be replaced with a monolayer or a multilayer photonic crystal slab.

In this structure, to increase light output, a mirror on the light output side needs optimization by making fine adjustments so that the reflectance of the mirror is less than 100%.

However, no method of controlling the peak value of reflectance of a mirror using the GR mode without causing optical loss has been found so far.

In the calculation results of the non-patent document 1 (FIG. 11A), the dip depth of transmittance (the peak height of reflectance) seemingly vary.

This happens because the results were not calculated with sufficient wavelength resolution.

Figure 11B:
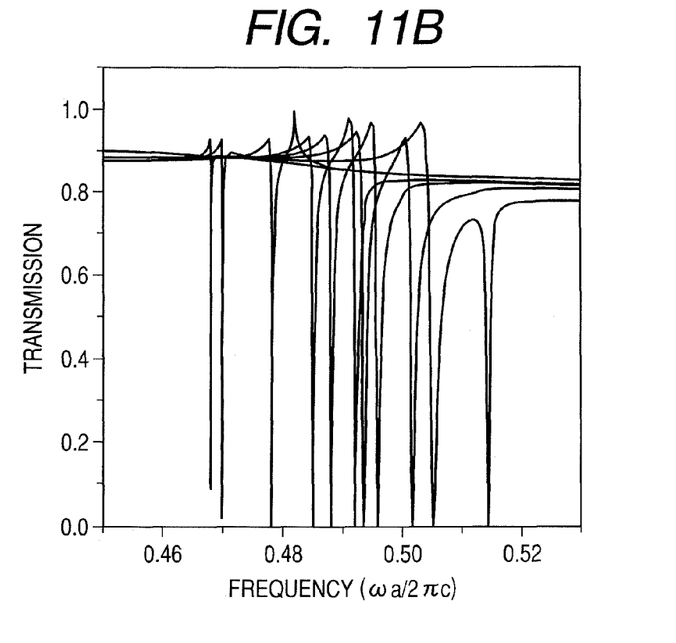

We have found that the reflectance reaches almost 100% by calculating with sufficiently high wavelength resolution (FIG. 11B). It is thus obvious that the non-patent document 1 does not disclose controlling the peak value of reflectance.

To overcome the problem, an object of the present invention is to provide a structure having a photonic crystal layer with which peak reflectance in the GR mode can be controlled; and a surface emitting laser including the structure.

SUMMARY OF THE INVENTION

The present invention provides a structure having a photonic crystal layer mentioned below and a surface emitting laser including the structure.

The present invention is directed to a structure having a photonic crystal layer, the layer comprising: a first member made of a material having a first refractive index; and a second member made of a material having a second refractive index, wherein the first member has a plurality of holes periodically arranged, and the second member is placed in each of the holes so that a center of the second member is staggered from a center of the hole on a plane of the photonic crystal layer.

The layer can have a periodical array of gaps, each of which gaps consists of a space between a hole wall of the hole and the second member and has the shape of a ring including an annular ring and a rectangular ring.

The first refractive index of the first member can be equal to the second refractive index of the second member.

The first and the second refractive indexes can be in the range of 1.2 to 4.0.

The present invention is directed to a surface emitting laser comprising a first reflecting mirror, an active layer and a second reflecting mirror, wherein the first reflecting mirror comprises the structure having a photonic crystal layer according to claim 1.

The first and second reflecting mirrors and the active layer can be formed over a GaAs substrate or a GaN substrate.

Further features of the present invention will become apparent from the following description of exemplary embodiments with reference to the attached drawings.

DESCRIPTION OF THE EMBODIMENTS

First Embodiment

Hereinafter, a structure having a photonic crystal layer according to a first embodiment of the present invention will be described.

Figure 1:
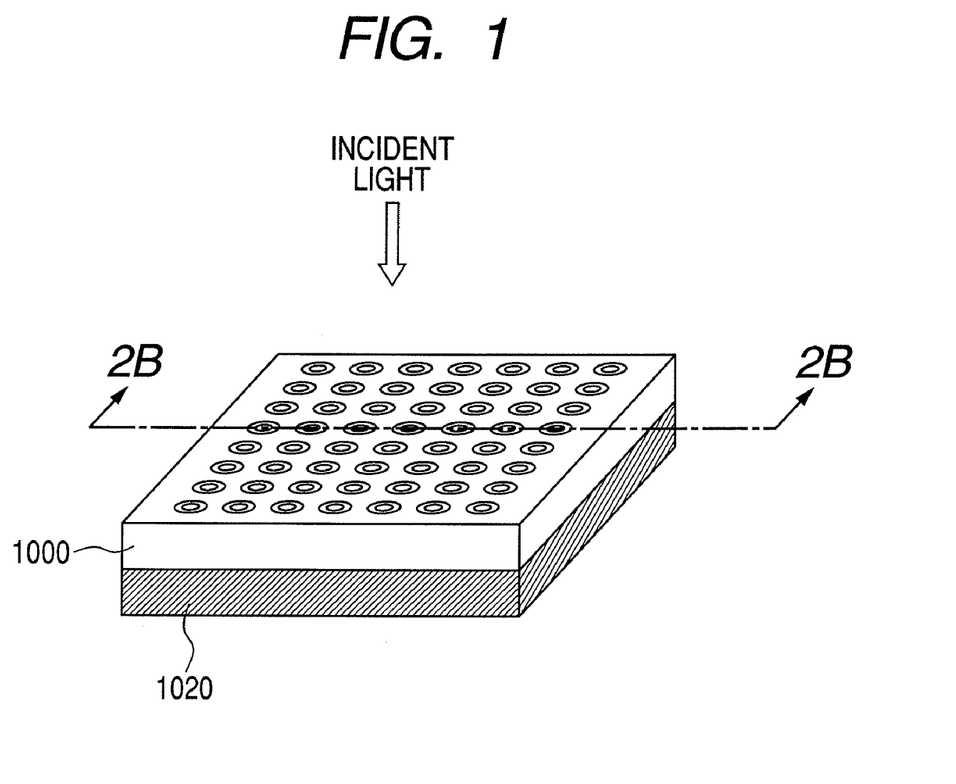
FIG. 1 is a perspective view illustrating a structure having a photonic crystal layer in the first embodiment of the present invention.

FIG. 1 is a perspective view illustrating a structure having a photonic crystal layer in the first embodiment of the present invention.

Figure 2A:
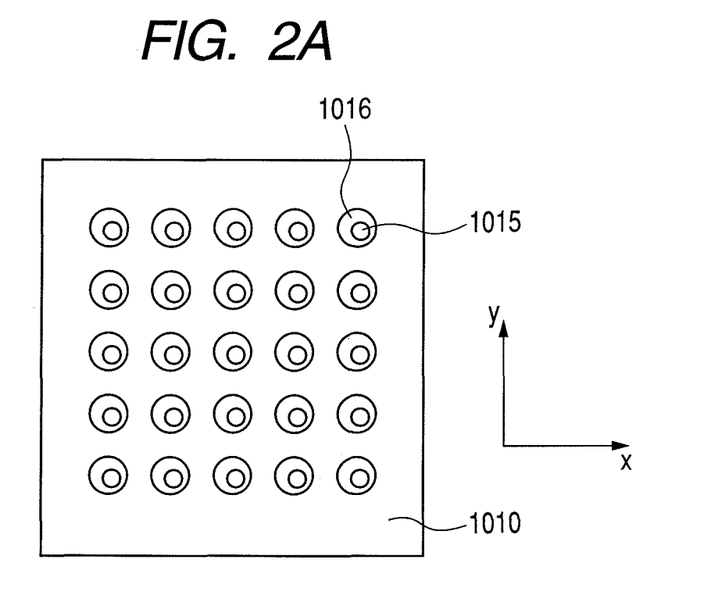
FIG. 2A is a top view and FIG. 2B is a section view each illustrating a structure having a photonic crystal layer in the first embodiment of the present invention.
Figure 2B:
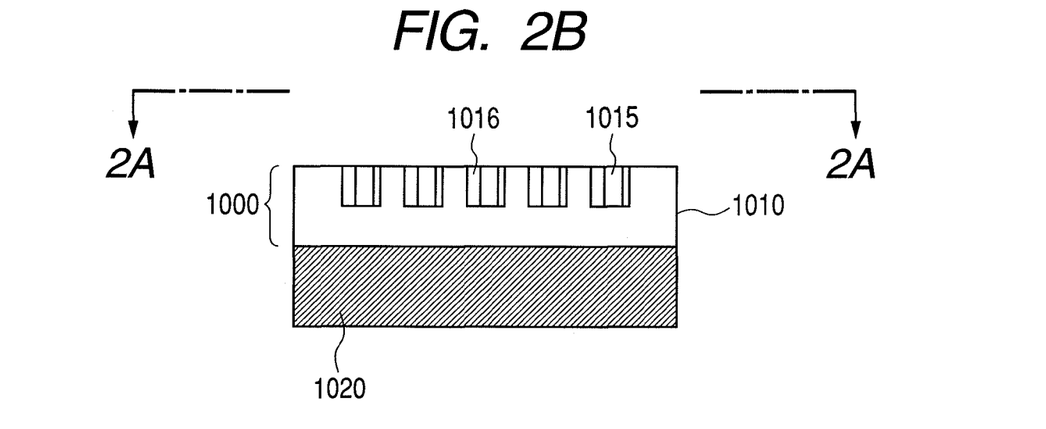

FIG. 2A is a top view and FIG. 2B is a section view each illustrating a structure having a photonic crystal layer in the first embodiment of the present invention.

FIGS. 1, 2A and 2B illustrate a photonic crystal layer 1000 where a first member (1010 in FIGS. 2A and 2B) made of a first material having a first refractive index ($n_1$) and the first member has a plurality of holes 1016 arranged periodically.

In the figures, a second member 1015 is made of a material having a second refractive index and the second member is placed in each of the holes arranged periodically.

The second member is placed in each of the holes so that a center of the second member is staggered from a center of the each hole on a plane of the photonic crystal layer.

In the figures, a low-refractive-index layer 1020 is adjacent to the photonic crystal layer 1000. The layer 1020 is made of a material having a refractive index lower than the first refractive index. The layer 1020 is sometimes referred to as a cladding layer.

As shown in FIG. 1, the structure according to the present embodiment is designed so that light incident on the photonic crystal layer 1000 in the thickness direction of the layer is reflected and the GR mode occurs with the wavelength of the incident light. In this case, light incident on the photonic crystal layer 1000 once travels through the layer but the light is radiated outward because the GR mode is closely connected to a radiation mode. The layer 1000 thus functions as a mirror.

FIGS. 3A to 3E illustrate calculation results of reflectance spectra when the center of a hole (outer circle) is staggered from the center of a second member (inner circle) in the x and y directions on a plane of the photonic crystal layer.

A distance staggered to the x direction is represented as $\Delta x$. A distance staggered to the y direction is represented as $\Delta y$.

The layer 1000 has a thickness of 500 nm. The pitch between the holes is 500 nm. The diameter of an outer circle of the each ring-shaped hole (outer diameter) is 400 nm. The diameter of an inner circle of the each ring-shaped hole (inner diameter) is 200 nm. The each hole has a depth of 500 nm. The calculation was conducted assuming that the slab and the inner circle have refractive indexes of 3.5 and the other portions have refractive indexes of 1.0.

Figure 3A:
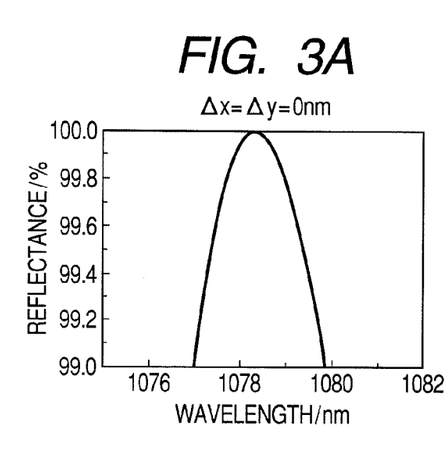
FIGS. 3A, 3B, 3C, 3D and 3E are graphs showing calculation results of reflectance spectrum when the center of a hole (outer circle) is staggered from the center of a second member (inner circle) to the x and y directions in the first embodiment of the present invention.
Figure 3B:
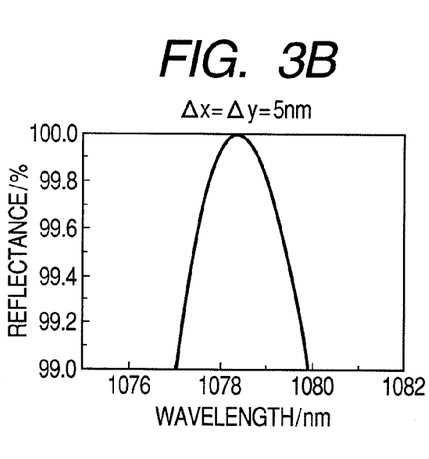
Figure 3C:
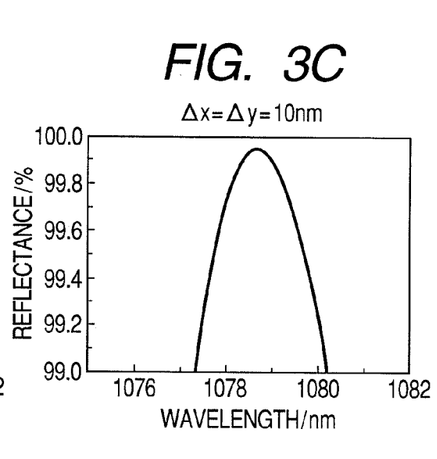
Figure 3D:
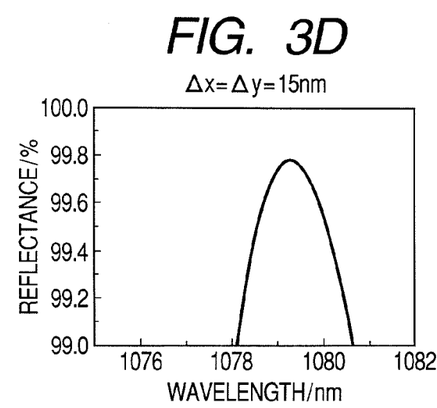
Figure 3E:
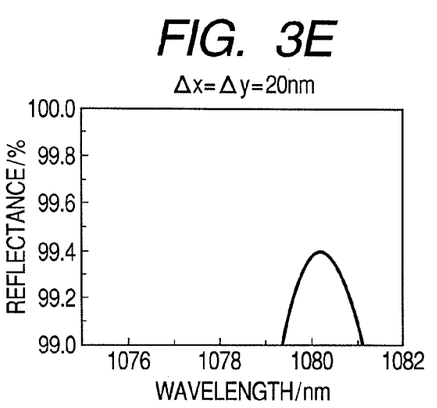

From the result shown in FIG. 3A, the peak value of reflectance certainly reaches almost 100% when the centers are not staggered from each other. As the centers are staggered further from each other, the peak value of reflectance decreases. As the displacement of the centers ($\Delta x$ and $\Delta y$) increases, the peak value of reflectance decreases and the wavelength also shifts slightly. For example, the peak wavelength in FIG. 3E shifts to the longer wavelength side by about 2 nm (about 0.2% in relation to the peak wavelength) when compared to FIG. 3A. When such wavelength shift needs to be compensated on designing the structure, the peak wavelength of reflectance can be optionally adjusted by a fine-tuning of a lattice constant. Specifically, decrease of a lattice constant by 0.2% results in shift of the peak wavelength of reflectance to the shorter wavelength side by about 0.2%.

Figures 4A, 4D:
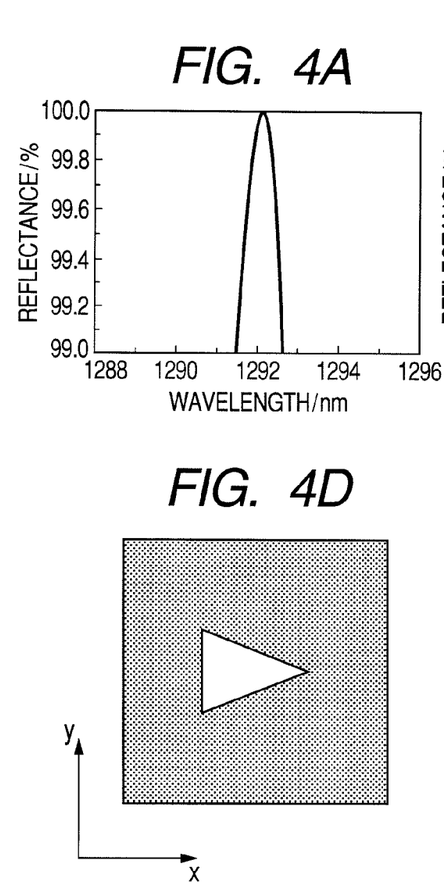
FIGS. 4A, 4B, 4C, 4D, 4E and 4F are graphs showing reflectance spectra in the first embodiment of the present invention.
Figures 4B, 4E:
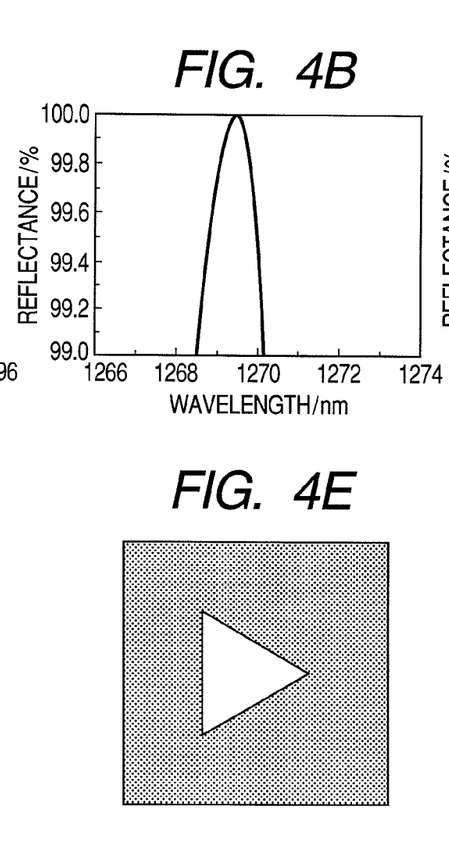
Figures 4C, 4F:
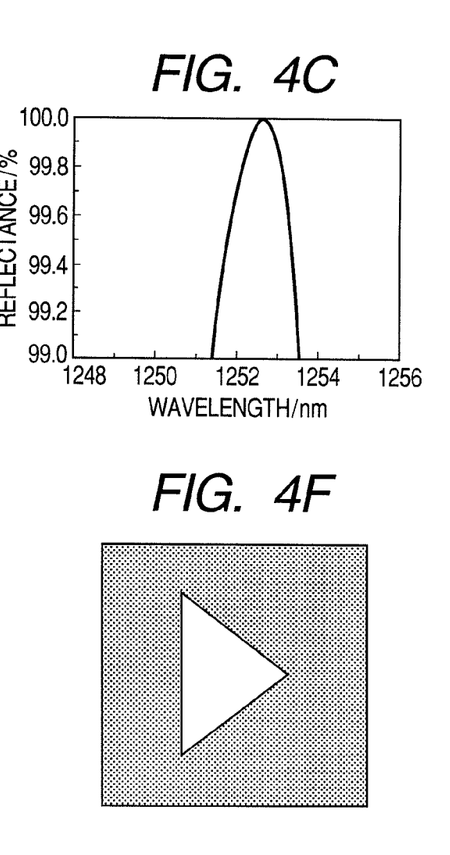

The peak value of reflectance decreases by displacing the centers from each other probably because the structure is out of symmetry (inversion symmetry or rotational symmetry). However, being out of symmetry does not always result in controlling reflectance. To describe this, for example, calculation results of reflectance spectra are shown in FIGS. 4A to 4F where light enters a photonic crystal in the thickness direction of the layer (perpendicular to the crystal plane) which crystal has triangular holes arranged in square lattice. FIGS. 4D, 4E and 4F illustrate unit structures of photonic crystal structures where the lengths of the holes in the directions of the x-axis are identical whereas the lengths of the holes in the directions of the y-axis are different.

FIG. 4E illustrates an equilateral triangle hole whereas FIGS. 4D and 4F illustrate isosceles triangle holes. FIGS. 4A, 4B and 4C show calculation results in the case of the structures illustrated in FIGS. 4D, 4E and 4F, respectively.

The layer has a thickness of 500 nm. The pitch between the holes is 500 nm. Each of the holes has a depth of 500 nm. The calculation was conducted assuming that the slab and the inner circle have refractive indexes of 3.5 and the other portions have refractive indexes of 1.0. Also, the incident light was assumed to have polarization where electric field vibrates parallel to the x-axis direction.

The results show that being out of symmetry of holes does not always result in decrease of the peak value of reflectance.

Figure 12A:
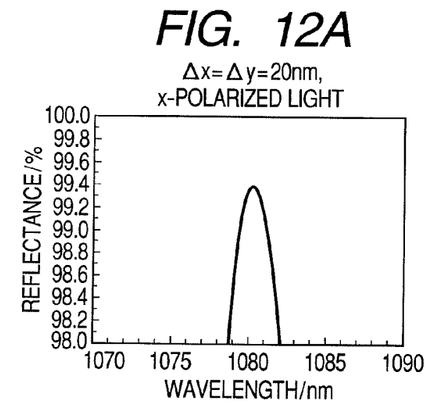
FIGS. 12A, 12B, 12C, 12D, 12E and 12F are graphs showing reflectance spectra in the first embodiment of the present invention.
Figure 12B:
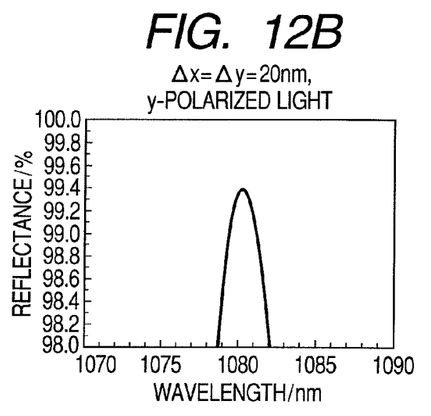
Figure 12C:
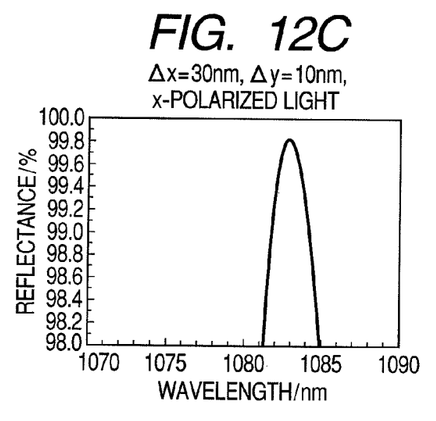
Figure 12D:
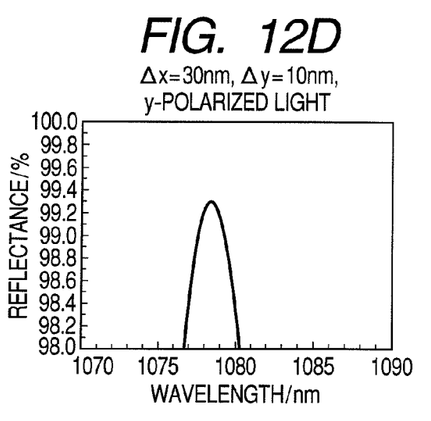
Figure 12E:
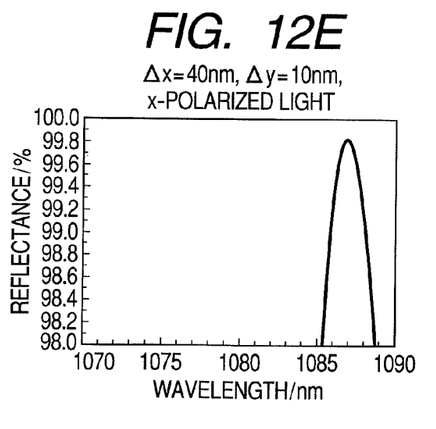
Figure 12F:
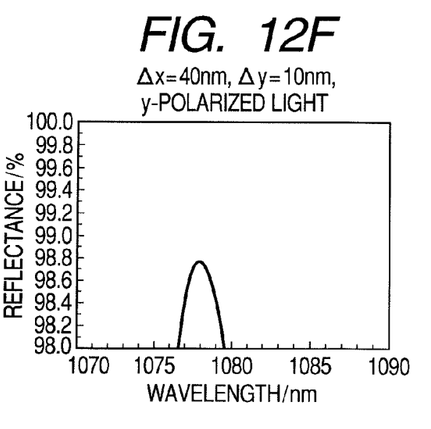

The results calculated in FIGS. 3A to 3E do not show polarization dependency of reflectance because of the condition of $\Delta x = \Delta y$. But, polarization property can be controlled by using condition of $\Delta x \neq \Delta y$. Such an example is shown in FIGS. 12A to 12F. Calculation results of reflectance spectra are shown in FIGS. 12A and 12B where $\Delta x = \Delta y = 20$ nm, in FIGS. 12C and 12D where $\Delta x = 30$ nm and $\Delta y = 10$ nm, and in FIGS. 12E and 12F where $\Delta x = 40$ nm and $\Delta y = 10$ nm. FIGS. 12A, 12C and 12E show reflectance spectra where the incident light is a plane wave polarizing in the x direction. FIGS. 12B, 12D and 12F show reflectance spectra where the incident light is a plane wave polarizing in the y direction. In the case of $\Delta x = \Delta y$ (FIGS. 12A and 12B), spectra do not change depending on the polarization directions. In contrast, in the case of $\Delta x \neq \Delta y$ (FIGS. 12C to 12F), polarization dependency is obviously shown. Also, the larger the difference between $\Delta x$ and $\Delta y$ becomes, the polarization dependency increases.

Next, the first member and the second member in a structure having a photonic crystal layer are described.

The first member made of a material having a first refractive index $n_1$ and the second member made of a material having a second refractive index $n_2$ do not necessarily have an identical refractive index. The refractive indexes of the members may be identical in the range of 1.2 to 4.0 inclusive. Specific materials may include Si, $SiO_2$, SiN, GaAs, $Al_xGa_{1-x}As$, GaN, $Al_xGa_{1-x}N$ and InP.

The hole and the second member have sections in the shape of a ring, a square, or the like. The ring shape may include an annular ring and a rectangular ring.

The holes are arranged periodically. The holes may be arranged in a triangular lattice or a square lattice.

Figure 13A:
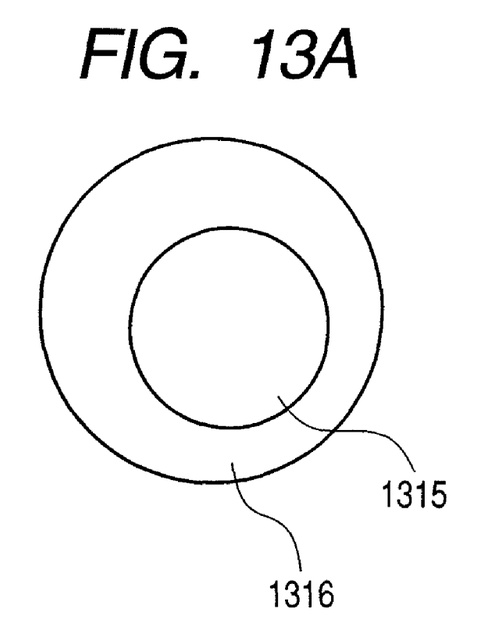
FIGS. 13A and 13B illustrate ring-shaped gaps in the first embodiment of the present invention.
Figure 13B:
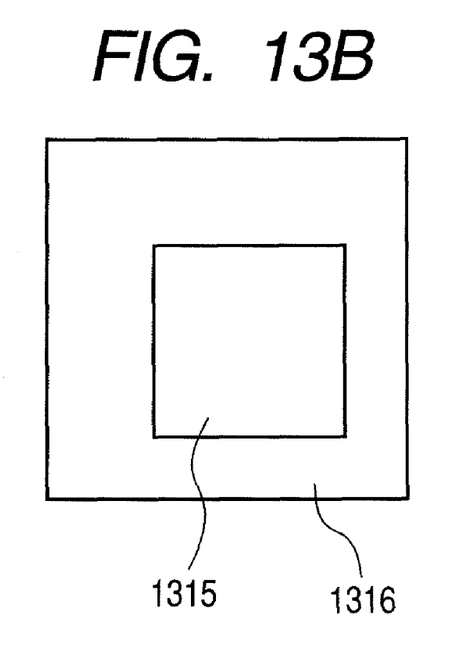

As a result, the photonic crystal layer has a gap with the shape of a ring including an annular ring and a rectangular ring. The gaps are formed by hole walls of the plurality of holes arranged periodically and the second members placed in the holes. The gaps are arranged periodically. FIG. 13A illustrates an example of an annular-ring-shaped gap. FIG. 13B illustrates an example of a rectangular-ring-shaped gap. The figures show the holes 1316 and the second members 1315.

The thickness t of the first member is determined in consideration of optical waveguide mode and preparation conditions. For example, the thickness t is in the range of 10 nm to 10 µm.

Second Embodiment

Hereinafter, a second embodiment of the present invention will be described which embodiment is a surface emitting laser including the structure having a photonic crystal layer according to the present invention.

Figure 5:
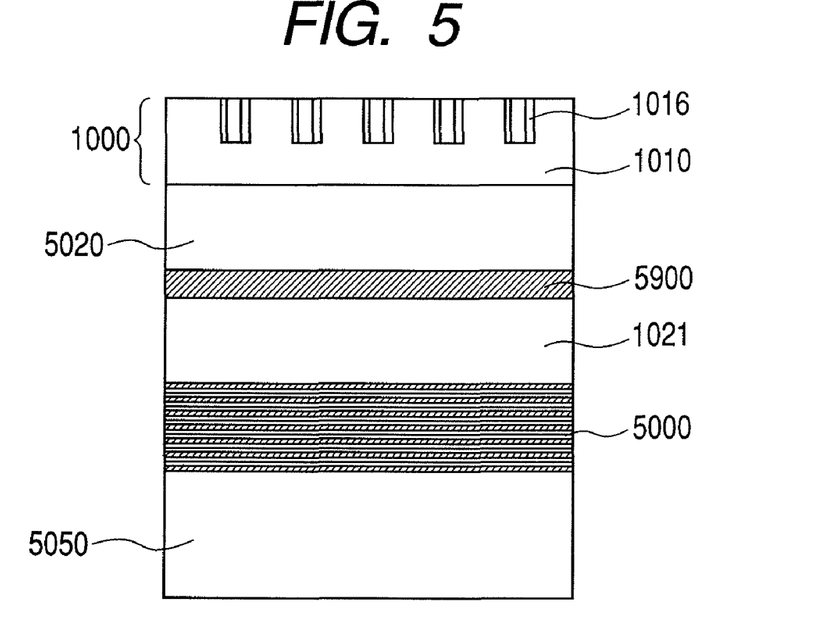
FIG. 5 is a schematic section view illustrating a vertical cavity surface emitting laser in the second embodiment of the present invention.

FIG. 5 is a schematic section view illustrating a vertical cavity surface emitting laser (VCSEL) in the present embodiment.

FIG. 5 shows a substrate 5050, a lower reflecting mirror 5000 such as a multilayer mirror, a lower cladding layer 1021, an active layer 5900 and an upper cladding layer 5020.

FIG. 5 also shows a first member 1010 forming a photonic crystal layer 1000.

The techniques described in the first embodiment are applied to the photonic crystal layer 1000.

The upper cladding layer 5020 of the present embodiment corresponds to the low-refractive-index layer 1020 of the first embodiment.

That is, the cladding layer 5020 functions as an upper cladding layer of the active layer 5900 and also as a low-refractive-index layer of the photonic crystal layer 1000.

The vertical cavity surface emitting laser of the present embodiment brings about lasing by resonating and amplifying light emitted in the active layer 5900 by using the lower and upper mirrors.

The wavelength of light emitted in the active layer is determined by material and structure of the active layer. Thus the active layer needs to be designed so that the GR mode in the photonic crystal layer, which functions as an upper reflecting mirror, corresponds to the wavelength of the light emission.

The present embodiment provides a vertical cavity surface emitting laser by using the photonic crystal layer 1000 described in the first embodiment as an upper reflecting mirror placed to face the lower reflecting mirror 5000 as illustrated in FIG. 5. The lower reflecting mirror is a multilayer mirror such as $Al_xGa_{1-x}As/Al_xGa_{1-x}As$, $GaN/Al_xGa_{1-x}N$ or $In_xGa_{1-x}As_yP_{1-y}/In_xGa_{1-x}As_yP_{1-y'}$. The photonic crystal layer described in the first embodiment may also be used as the lower reflecting mirror.

Next, the active layer, the cladding layer, and the substrate of the vertical cavity surface emitting laser in the present embodiment are described.

The active layer 5900 has a multiple quantum well structure formed by using materials such as GaInP/AlGaInP or GaN/InGaN.

The cladding layer 1021 is formed with AlGaInP, AlGaN, or the like.

The substrate 5050 is formed with GaAs, GaN, or the like.

The surface emitting laser of the present embodiment functions by optically pumping or current injection. In FIG. 5, electrodes and the like are omitted.

The simulation described above was conducted by using transfer matrix method described in a document: Physical Review B, Vol. 68, 15 5101 (2003).

EXAMPLES

Hereinafter, examples according to the present invention are described.

Example 1

In Example 1, a two-dimensional photonic crystal mirror according to the present invention is described.

Figure 6:
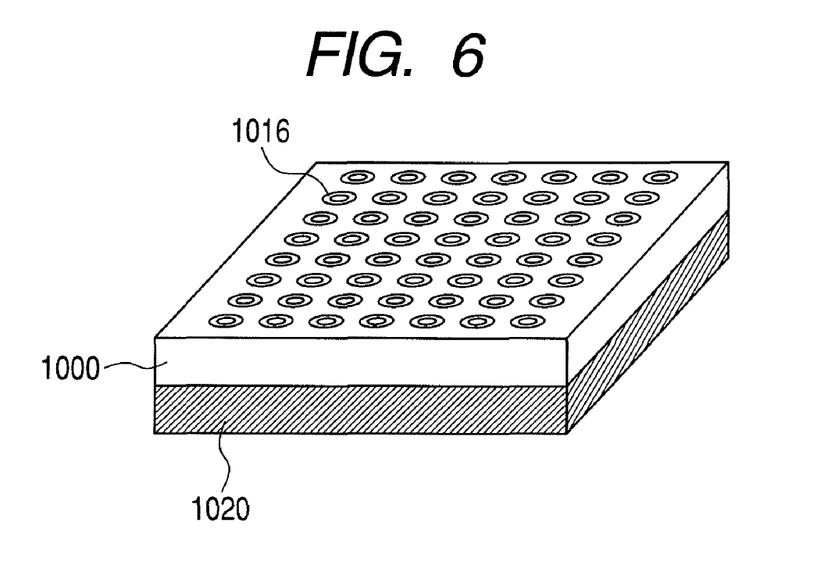
FIG. 6 is a schematic view illustrating a two-dimensional photonic crystal mirror in Example 1 of the present invention.

FIG. 6 is a schematic view illustrating a two-dimensional photonic crystal mirror of the present Example.

FIG. 6 shows a photonic crystal layer 1000 having ring-shaped holes arranged in square lattice on a GaN layer.

The layer 1000 has a thickness of 175 nm. The pitch between the holes is 175 nm. The diameter of an outer circle of the each ring-shaped hole (outer diameter) is 157 nm. The diameter of an inner circle of the each ring-shaped hole (inner diameter) is 143 nm. The each hole has a depth of 175 nm. FIG. 6 also shows a substrate 1020 made of $Al_{0.4}Ga_{0.6}N$. In the present Example, the first member and the second member are formed with the same material.

That is, the first refractive index ($n_1$) is equal to the second refractive index ($n_2$). The center of the outer circle is staggered from the center of the inner circle by 1 nm both to the x and y directions on a plane of the photonic crystal layer.

Figure 7A:
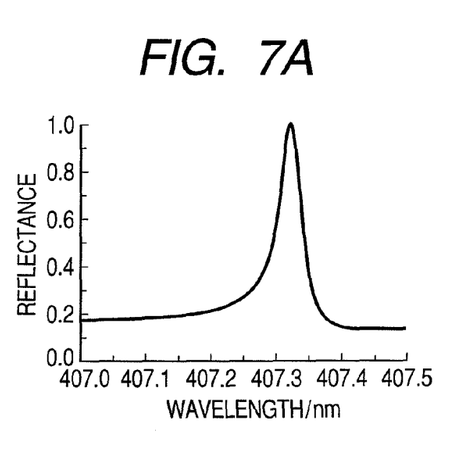
FIGS. 7A, 7B and 7C are graphs showing reflectance spectra of a two-dimensional photonic crystal mirror in Example 1 of the present invention.
Figure 7B:
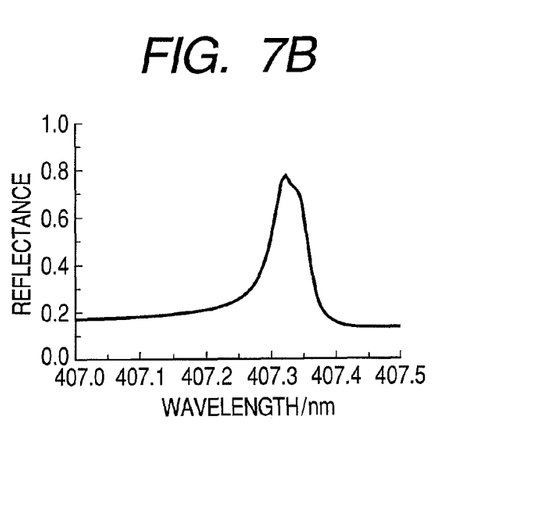
Figure 7C:
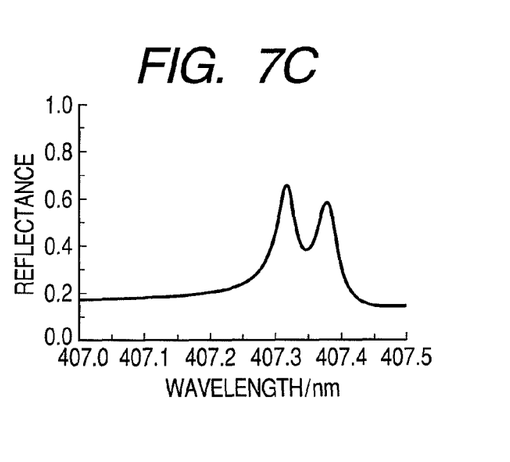

FIGS. 7A to 7C are graphs showing reflectance spectra of the two-dimensional photonic crystal mirror in Example 1 of the present invention.

FIG. 7B shows a calculation result of reflectance spectrum in the structure illustrated in FIG. 6.

The calculation was conducted assuming that GaN had a refractive index of 2.54 and $Al_{0.4}Ga_{0.6}N$ had a refractive index of 2.32.

For convenience in conducting the calculation, the substrate 1020 is assumed to have infinite thickness. The peak value of reflectance is about 80%.

For comparison, calculation results are also shown in FIG. 7A where the center of the outer circle is placed at the center of the inner circle (that is, $\Delta x=\Delta y=0$ nm) and in FIG. 7C where the center of the outer circle is staggered from the center of the inner circle by 2 nm both to the x and y directions (that is, $\Delta x=\Delta y=2$ nm).

From the results, it has been established that the peak value of reflectance reaches almost 100% when the centers are at the same point. Also, as the centers are staggered further from each other, the peak value of reflectance decreases.

Example 2

In Example 2, a vertical cavity surface emitting laser (VCSEL) according to the present invention is described.

Figure 8:
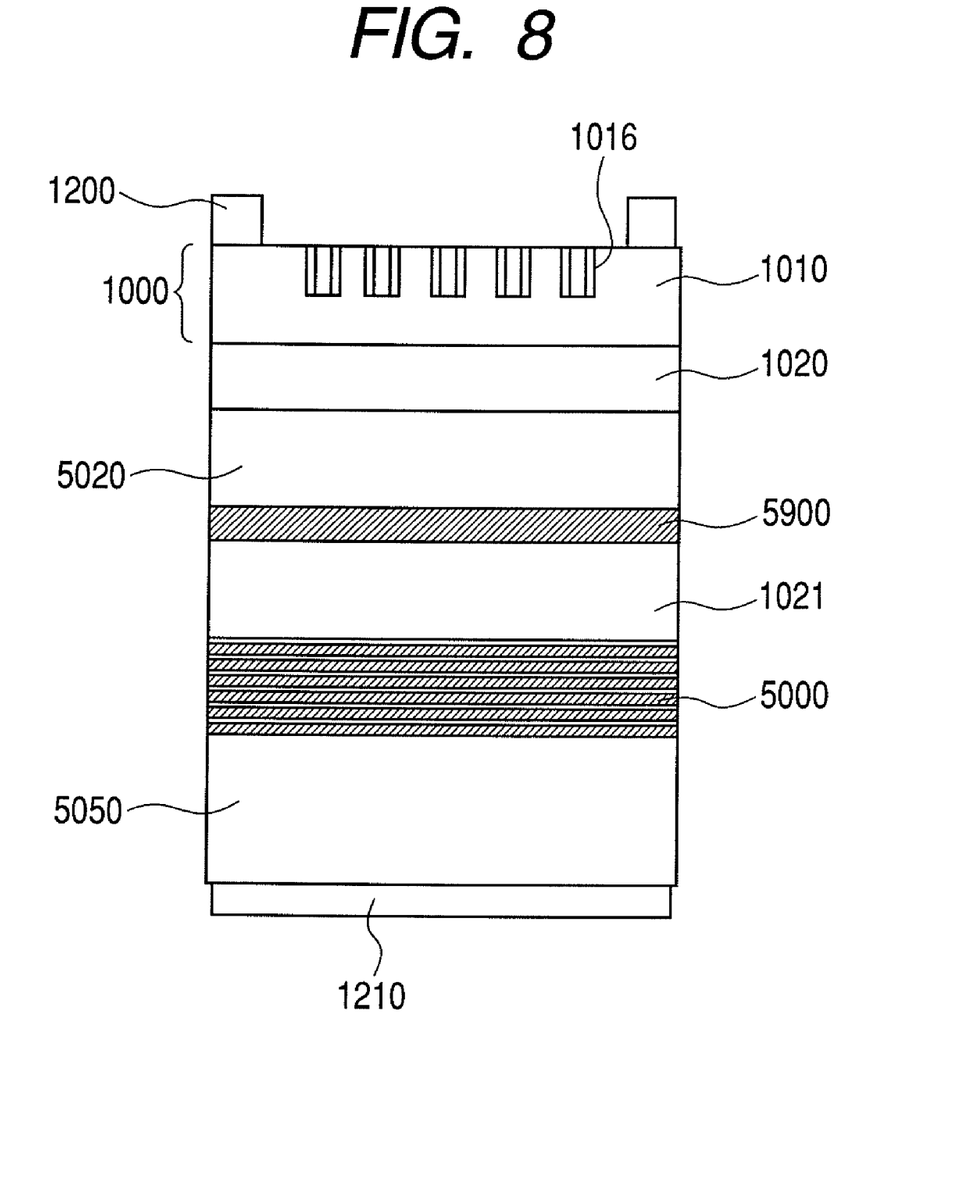
FIG. 8 is a schematic view illustrating a vertical cavity surface emitting laser in Example 2 of the present invention.

Typically, a VCSEL has a first reflecting mirror, an active layer and a second reflecting mirror. The first and second reflecting mirrors are DBR mirrors such as semiconductor multilayer mirrors or dielectric mirrors. In the present Example, the structure having a photonic crystal layer is used as at least one of the first and second reflecting mirrors. FIG. 8 is a schematic view illustrating the vertical cavity surface emitting laser (VCSEL) in the present Example.

FIG. 8 shows a photonic crystal layer 1000 having holes 1016 arranged in square lattice on an $Al_{0.5}Ga_{0.5}As$ layer.

The layer 1000 has a thickness of 217 nm. The pitch between the holes is 217 nm. The outer diameter of the each hole is 87 nm. The inner diameter of the each hole is 43 nm. The each hole has a depth of 217 nm.

The center of the outer circle is staggered from the center of the inner circle by 1.75 nm both to the x and y directions (Δx=Δy=1.75 nm).

FIG. 8 shows an $Al_{0.93}Ga_{0.07}As$ low-refractive-index layer 1020, a p-type AlGaInP cladding layer 5020, a GaInP/AlGaInP multiple quantum well active layer, an n-type AlGaInP cladding layer 1021, an n-type $Al_{0.93}Ga_{0.07}As/Al_{0.5}Ga_{0.5}As$-DBR lower mirror layer 5000, a GaAs or GaN substrate 5050, a ring-shaped upper electrode 1200 and a lower electrode 1210.

The vertical cavity surface emitting laser (VCSEL) of the present Example has an upper mirror layer, which is the photonic crystal layer, a lower mirror layer and the active layer over the GaAs or GaN substrate.

Figure 9:
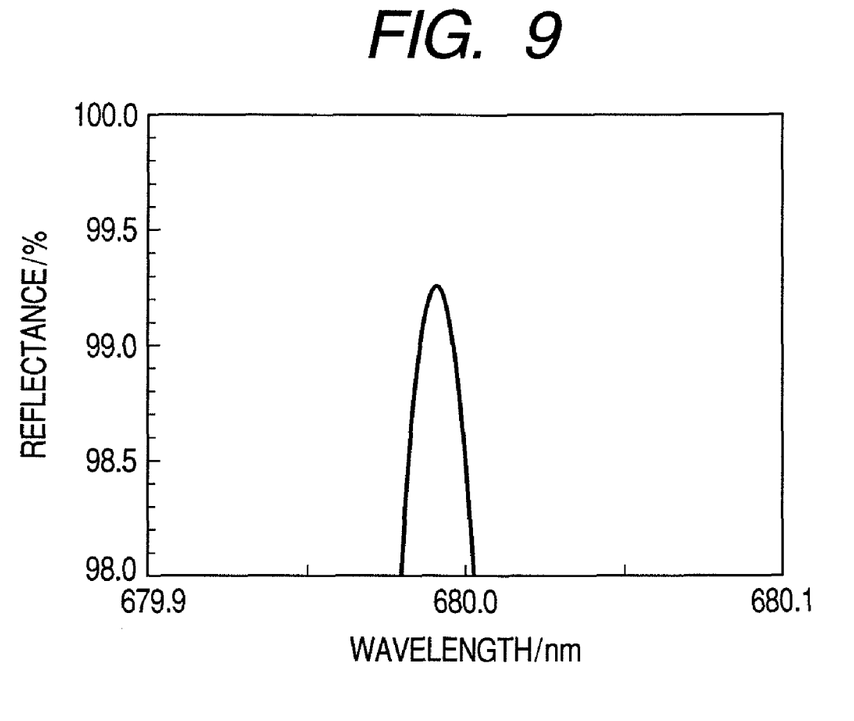
FIG. 9 is a graph showing a reflectance spectrum of a photonic crystal mirror forming a vertical cavity surface emitting laser in Example 2 of the present invention.

FIG. 9 is a graph showing a reflectance spectrum of the photonic crystal layer forming the vertical cavity surface emitting laser (VCSEL) in the present Example.

The graph of FIG. 9 shows a calculation result of reflectance spectrum of the photonic crystal layer.

From the result, the layer functions as a high-reflectance mirror at and around a wavelength of 680 nm. The peak value of reflectance is about 99.3%.

Likewise, the lower mirror layer 5000 is also designed to exhibit high reflectance at and around a wavelength of 680 nm.

Reflecting mirror length defined as the distance between the photonic crystal layer 1000 and the lower mirror layer 5000 is designed so that the antinode of a standing wave generated in a reflecting mirror coincides with the active layer 5900.

In designing the surface emitting laser, commonly used techniques for designing surface emitting lasers may be used without changing the techniques.

The surface emitting laser mentioned above brings about lasing by resonating and amplifying light emitted in the active layer 5900 by using the lower and upper mirrors.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-110109, filed Apr. 19, 2007, which is hereby incorporated by reference herein in its entirety.

What is claimed is:

1. A structure having a photonic crystal layer, the layer comprising:
    a first member made of a material having a first refractive index; and
    a plurality of second members made of a material having a second refractive index,
    wherein the first member has a plurality of holes periodically arranged, and the plurality of second members are placed correspondingly in plurality of holes so that a center of each of the plurality of second members is staggered from a center of a corresponding hole of the plurality of holes with respect to a plane of the photonic crystal layer,
    wherein the plurality of second members are arranged such that the plurality of second members are fixed on the first member,
    wherein the layer has a periodical array of gaps, each gap including a space between a hole wall of one of the plurality of holes and a corresponding second member of the plurality of second members, and each gap having a shape of a ring, the ring being an annular ring or a rectangular ring,
    wherein the structure is incorporated in a surface emitting laser that includes a first reflecting mirror, an active layer, and a second reflecting mirror, and
    wherein the structure is included in the first reflecting mirror.

2. The structure having a photonic crystal layer according to claim 1, wherein the first and the second refractive indexes are in a range of 1.2 to 4.0.

3. The structure having a photonic crystal layer according to claim 1, wherein the first and second reflecting mirrors and the active layer are formed over a GaAs substrate or a GaN substrate.

4. A structure having a photonic crystal layer, the layer comprising:
    a first member made of a material having a first refractive index; and
    a plurality of second members made of a material having a second refractive index,
    wherein the first member has a plurality of holes periodically arranged, and the plurality of second members are placed correspondingly in plurality of holes so that a center of each of the plurality of second members is staggered from a center of a corresponding hole of the plurality of holes with respect to a plane of the photonic crystal layer,
    wherein the plurality of second members are arranged such that the plurality of second members are fixed on the first member,
    wherein the first refractive index of the first member is equal to the second refractive index of the plurality of second members,
    wherein the structure is incorporated in a surface emitting laser that includes a first reflecting mirror, an active layer, and a second reflecting mirror, and
    wherein the structure is included in the first reflecting mirror.

5. The structure having a photonic crystal layer according to claim 4, wherein the first and the second refractive indexes are in a range of 1.2 to 4.0.

6. The structure having a photonic crystal layer according to claim 4, wherein the first and second reflecting mirrors and the active layer are formed over a GaAs substrate or a GaN substrate.

* * * * *